United States Patent
Yip et al.

(10) Patent No.: US 9,659,950 B2
(45) Date of Patent: *May 23, 2017

(54) SEMICONDUCTOR DEVICES INCLUDING STAIR STEP STRUCTURES, AND RELATED METHODS

(71) Applicant: Micron Technology, Inc., Boise, ID (US)

(72) Inventors: Aaron Yip, Los Gatos, CA (US);
Qiang Tang, Cupertino, CA (US);
Chang Wan Ha, San Ramon, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/877,997

(22) Filed: Oct. 8, 2015

(65) Prior Publication Data

US 2016/0027793 A1 Jan. 28, 2016

Related U.S. Application Data

(63) Continuation of application No. 13/932,551, filed on Jul. 1, 2013, now Pat. No. 9,165,937.

(51) Int. Cl.
*H01L 27/115* (2006.01)
*H01L 27/11556* (2017.01)
*G11C 16/06* (2006.01)

(52) U.S. Cl.
CPC ........ *H01L 27/11556* (2013.01); *G11C 16/06* (2013.01); *H01L 27/115* (2013.01)

(58) Field of Classification Search
CPC ............. H01L 27/115; H01L 27/11551; H01L 27/11553; H01L 27/11578; H01L 27/1158
See application file for complete search history.

(56) References Cited

U.S. PATENT DOCUMENTS 7,177,191 B2 2/2007 Fasoli et al.
8,169,827 B2 5/2012 Guzzi et al.
(Continued)

FOREIGN PATENT DOCUMENTS

CN 102709269 A 10/2012
JP 2012069710 A 4/2012
(Continued)

OTHER PUBLICATIONS

Japanese Notice of Allowance for Japanese Application No. 2015-563030, dated Jun. 7, 2016, 4 pages with English Translation.
(Continued)

*Primary Examiner* — Allison P Bernstein
(74) *Attorney, Agent, or Firm* — TraskBritt

(57) ABSTRACT

Semiconductor devices, such as three-dimensional memory devices, include a memory array including a stack of conductive tiers and a stair step structure. The stair step structure is positioned between first and second portions of the memory array and includes contact regions for respective conductive tiers of the stack of conductive tiers. The first portion of the memory array includes a first plurality of select gates extending in a particular direction over the stack. The second portion of the memory array includes a second plurality of select gates also extending in the particular direction over the stack of conductive tiers. Methods of forming and methods of operating such semiconductor devices, including vertical memory devices, are also disclosed.

20 Claims, 4 Drawing Sheets

(56) References Cited

U.S. PATENT DOCUMENTS

| | | |
|---|---|---|
| 8,374,051 B2 | 2/2013 | Yan et al. |
| 8,405,142 B2 | 3/2013 | Katsumata et al. |
| 8,569,829 B2 | 10/2013 | Kiyotoshi |
| 8,581,323 B2 | 11/2013 | Uenaka et al. |
| 8,704,205 B2 | 4/2014 | Chen et al. |
| 2007/0252201 A1 | 11/2007 | Kito et al. |
| 2009/0310415 A1 | 12/2009 | Jin et al. |
| 2010/0207186 A1 | 8/2010 | Higashi et al. |
| 2010/0320526 A1 | 12/2010 | Kidoh et al. |
| 2010/0323505 A1 | 12/2010 | Ishikawa et al. |
| 2011/0018036 A1 | 1/2011 | Hwang et al. |
| 2011/0031630 A1 | 2/2011 | Hashimoto |
| 2011/0115010 A1 | 5/2011 | Shim et al. |
| 2011/0256707 A1 | 10/2011 | Pachamuthu et al. |
| 2011/0266604 A1 | 11/2011 | Kim et al. |
| 2011/0316072 A1 | 12/2011 | Lee |
| 2012/0129301 A1 | 5/2012 | Or-Bach et al. |
| 2012/0132983 A1 | 5/2012 | Fukuzumi |
| 2012/0280299 A1 | 11/2012 | Yun et al. |
| 2012/0306089 A1 | 12/2012 | Freeman et al. |
| 2013/0009274 A1 | 1/2013 | Lee et al. |
| 2013/0010523 A1 | 1/2013 | Yan et al. |
| 2013/0052803 A1 | 2/2013 | Roizin et al. |
| 2013/0130495 A1 | 5/2013 | Higashitani et al. |
| 2014/0241026 A1 | 8/2014 | Tanzawa |
| 2015/0001613 A1 | 1/2015 | Yip et al. |

FOREIGN PATENT DOCUMENTS

| | | |
|---|---|---|
| KR | 1020100137349 | 12/2010 |
| KR | 1020110054361 | 5/2011 |
| KR | 1020110140018 A | 12/2011 |

OTHER PUBLICATIONS

Korean further Office Action for Korean Application No. 10-2016-7001989, dated Jun. 27, 2016, 6 pages with English Translation.

Endoh et al., "Novel Ultrahigh Density Flash Memory with a Stacked Surrounding Gate Transistor (S-SGT) Structured Cell," IEEE Transactions on Electron Devices, vol. 50, No. 4, pp. 945-951 (Apr. 2003).

Fukuzumi et al., "Optimal Integration and Characteristics of Vertical Array Devices for Ultra High Density, Bit Cost Scalable Flash Memory," IEDM Technical Digest, pp. 449-452 (2007).

Tanaka et al., "Bit Cost Scalable Technology with Punch and Plug Process for Ultra High Density Flash Memory," Symposium on VLSI Technology Digest of Technical Papers, pp. 14-15 (2007).

International Search Report, ISA/KR, International Application No. PCT/US2014/044603, Oct. 12, 2014, three (3) pages.

Written Opinion of the International Searching Authority, ISA/KR, International Application No. PCT/US2014/044603, Oct. 12, 2014, five (5) pages.

Korean Office Action for Korean Application No. 10-2016-7001989, dated Feb. 5, 2016, 11 pages.

Chinese Office Action for Chinese Application No. 201480038462.0, dated Sep. 14, 2016, 9 pages with English translation.

European Search Report for European Application No. 14820536.2, dated Feb. 15, 2017, 7 pages.

SEMICONDUCTOR DEVICES INCLUDING STAIR STEP STRUCTURES, AND RELATED METHODS

CROSS-REFERENCE TO RELATED APPLICATION

This application is a continuation of U.S. patent application Ser. No. 13/932,551, filed Jul. 1, 2013, now U.S. Pat. No. 9,165,937, issued Oct. 20, 2015, the disclosure of which is hereby incorporated herein in its entirety by this reference.

TECHNICAL FIELD

Embodiments of the present disclosure relate to apparatuses such as three-dimensional semiconductor devices that include stair step structures defining contact regions, and related methods of forming and of operating such semiconductor devices.

BACKGROUND

The semiconductor industry has continually sought ways to produce memory devices with an increased number of memory cells per memory die. In non-volatile memory (e.g., NAND flash memory), one way to increase memory density is by using a vertical memory array, which is also referred to as a three-dimensional (3-D) memory array. One type of vertical memory array includes semiconductor pillars that extend through openings (e.g., holes) in tiers (e.g., layers, plates) of conductive material (e.g., word line plates, control gate plates), with dielectric materials at each junction of the semiconductor pillars and the conductive materials. Thus, multiple transistors can be formed along each pillar. Vertical memory array structures enable a greater number of transistors to be located in a unit of die area by building the array upwards (e.g., vertically) on a die, as compared to structures with conventional planar (e.g., two-dimensional) arrangements of transistors.

Vertical memory arrays and methods of forming them are described in, for example, U.S. Patent Application Publication No. 2007/0252201 of Kito et al.; Tanaka et al., "Bit Cost Scalable Technology with Punch and Plug Process for Ultra High Density Flash Memory," Symposium on VLSI Technology Digest of Technical Papers, pp. 14-15 (2007); Fukuzumi et al., "Optimal Integration and Characteristics of Vertical Array Devices for Ultra-High Density, Bit-Cost Scalable Flash Memory," IEDM Technical Digest, pp. 449-52 (2007); and Endoh et al., "Novel Ultrahigh-Density Flash Memory with a Stacked-Surrounding Gate Transistor (S-SGT) Structured Cell," IEEE Transactions on Electron Devices, vol. 50, no. 4, pp. 945-951 (April, 2003).

Conventional vertical memory arrays include an electrical connection between the conductive materials (e.g., word line plates) and access lines (e.g., word lines) so that memory cells in the 3-D array may be uniquely selected for writing, reading, or erasing operations. One method of forming an electrical connection includes forming a so-called "stair step" structure at an edge of the conductive materials. The stair step structure includes individual "steps" that define contact regions over which a vertical conductor is formed to provide electrical access to the respective conductive materials.

Further improvements and reductions in cost in the manufacturing of such structures, as well as alternative structures and methods for reducing an area covered by the stair step vertical memory arrays, are desired. In addition, improvements in the formation of structures including a higher number of memory cells and conductive tiers are desired.

BRIEF DESCRIPTION OF THE DRAWINGS

FIG. 3 illustrates a perspective view of the memory array block including four stair step structures according to an embodiment of the present disclosure.

FIG. 4 illustrates a perspective view of a portion of the memory array block of FIG. 3 indicated by phantom line A.

FIG. 5 illustrates a top view of the portion of the memory array block of FIG. 3 indicated by phantom line A.

DETAILED DESCRIPTION

Figure 1:
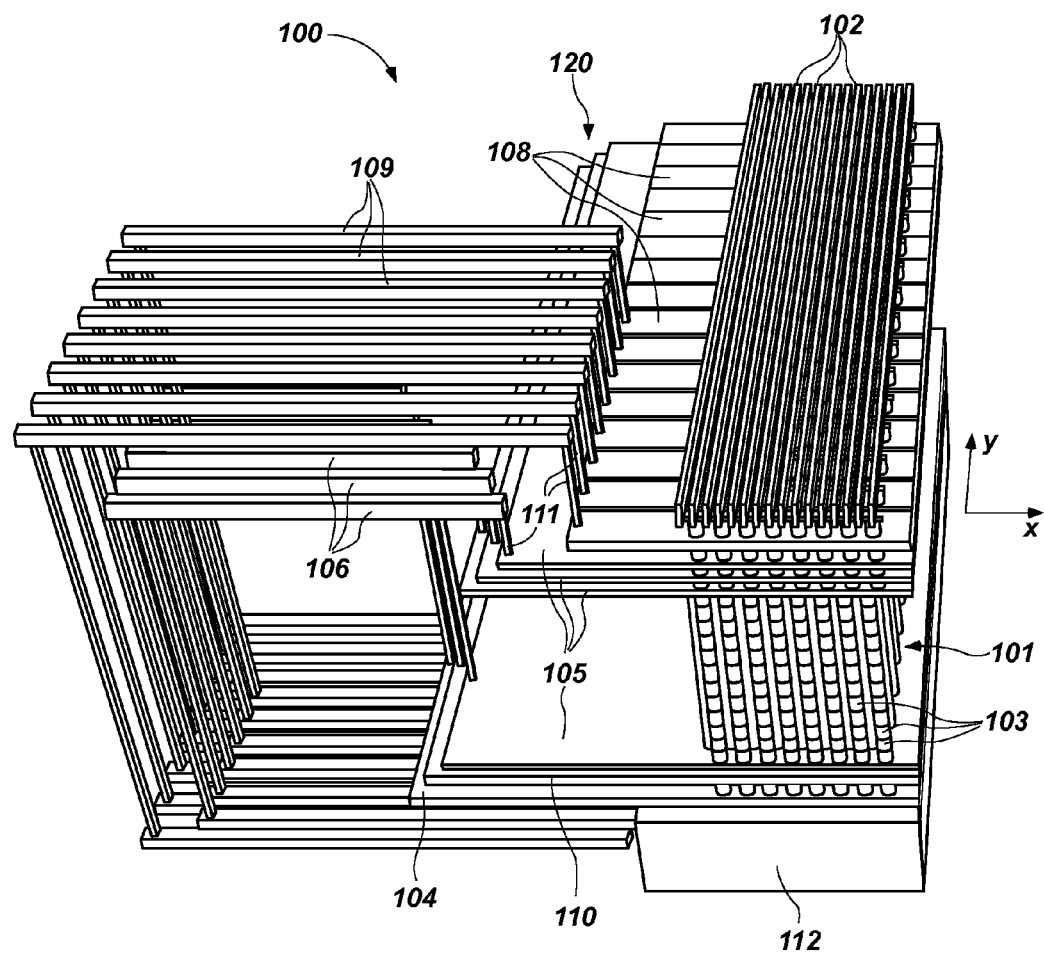
FIG. 1 illustrates a partially cutaway perspective view of a semiconductor device structure that includes a conventional stair step structure.

The following description provides specific details, such as material types, material thicknesses, and processing conditions in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional fabrication techniques employed in the industry.

In the following detailed description, reference is made to the accompanying drawings, which form a part hereof, and in which are shown, by way of illustration, specific embodiments in which the present disclosure may be practiced. These embodiments are described in sufficient detail to enable a person of ordinary skill in the art to practice the present disclosure. However, other embodiments may be utilized, and structural, logical, and electrical changes may be made without departing from the scope of the disclosure. The illustrations presented herein are not meant to be actual views of any particular system, device, or structure, but are merely idealized representations that are employed to describe the embodiments of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

The materials described herein may be formed by any suitable technique including, but not limited to, spin coating, blanket coating, chemical vapor deposition (CVD), atomic layer deposition (ALD), plasma enhanced ALD, or physical vapor deposition (PVD), unless otherwise specified. Depending on the specific material to be formed, the technique for depositing or growing the material may be selected by a person of ordinary skill in the art. While the materials described and illustrated herein may be formed as layers, the materials are not limited thereto and may be formed in other three-dimensional configurations.

As used herein, the term "substantially" in reference to a given parameter, property, or condition means and includes to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition may be at least 90% met, at least 95% met, or even at least 99% met.

As used herein, the phrase "semiconductor device structure" means and includes a structure, device, or system used in the formation of a semiconductor device and which may or may not be present in the semiconductor device in its final form. For example, a semiconductor device structure may be an intermediate structure present in the formation of a semiconductor device or system or a final structure comprising at least a portion of a semiconductor device or system. "Semiconductor device structure" encompasses structures for memory, solar cells, light emitting diodes (LEDs), processors, and other devices and systems that may or may not include one or more semiconductor materials.

As used herein, any relational term, such as "first," "second," "over," "under," "on," "underlying," etc., is used for clarity and convenience in understanding the disclosure and accompanying drawings and does not connote or depend on any specific preference, orientation, or order, except where the context clearly indicates otherwise.

As used herein, the terms "vertical" and "horizontal" are in reference to a major plane of a substrate in or on which the structures described are formed and are not necessarily defined by earth's gravitational field. A "horizontal" direction is a direction that is substantially parallel to the major plane of the substrate, while a "vertical" direction is a direction that is substantially perpendicular to the major plane of the substrate. The major plane of the substrate is defined by a surface of the substrate having a relatively large area compared to other surfaces of the substrate, such as by a substantially planar circular surface of a conventional semiconductor wafer substrate.

As used herein, the terms "lateral" and "laterally" refer to a direction that extends horizontally across a width of an elongated member and that is substantially perpendicular to a longitudinal axis of the elongated member. Unless stated otherwise, the "lateral" direction referred to herein is in reference to an elongated memory array block. For example, a lateral side surface (i.e., a surface that faces in a lateral direction) of an elongated member may extend along the elongated member between longitudinal ends of the elongated member and between vertically lower and upper surfaces of the elongated member.

As used herein, the phrase "coupled to" refers to elements operatively connected with each other, such as electrically connected through a direct ohmic connection or through an indirect connection (e.g., via another element).

Semiconductor devices (e.g., vertical memory devices, such as three-dimensional NAND memory devices) including stair step structures defining contact regions on conductive materials (e.g., conductive tiers, conductive layers, conductive plates) are disclosed, as are methods of forming such devices. The semiconductor devices of the present disclosure may include one or more stair step structures along a lateral side surface of the memory array block. In some embodiments, the contact regions may be positioned along the memory array block in more than one stair step structure. In some embodiments, the stair step structures may be recessed from a lateral side surface of the memory array block. In some embodiments, the stair step structures may be positioned in a longitudinal location along the memory array block between the longitudinal ends of the memory array block, such as longitudinally between vertical strings of memory cells. Since the stair step structures may be positioned internally (e.g., between longitudinal ends of the memory array block and between lateral side surfaces of the memory array block), the stair step structures may be considered "stairwells" between memory array regions of the memory array block. Positioning the contact regions along the lateral side surface of the memory array block may result in a greater number of conductive tiers used in the memory array block without adding additional lateral width (or adding a minimal lateral width) to the memory array block. In addition, access lines may be physically separated from each other at a greater distance to reduce electrical stress between adjacent access lines, without adding any lateral width (or adding a minimal lateral width) to the memory array block. While the non-volatile memory devices described herein may make specific reference to NAND devices, the disclosure is not so limited and may be applied to other semiconductor and memory devices.

Figure 2:
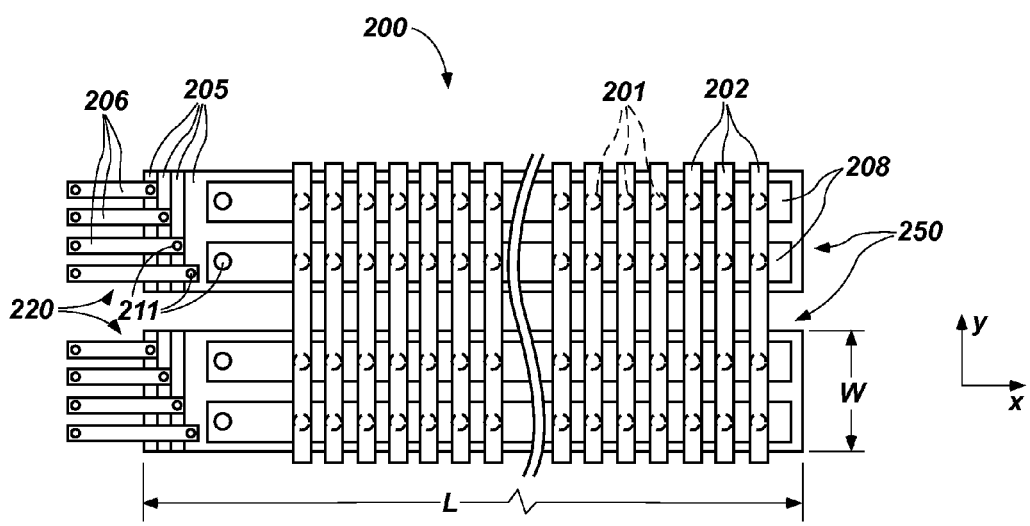
FIG. 2 illustrates a top view of a portion of a semiconductor device structure showing two elongated memory array blocks and a conventional stair step structure at a longitudinal end of each of the elongated memory array blocks.

FIGS. 1 and 2 and the accompanying description thereof in this specification are provided to enhance an understanding by one of ordinary skill in the art of embodiments of the present disclosure, and are not admitted by applicants as prior art for any purpose.

FIG. 1 illustrates a partially cutaway perspective view of a portion of a three dimensional (3-D) semiconductor device structure 100 that includes a stair step structure 120 for defining contact regions for connecting access lines 106 to conductive tiers 105 (e.g., conductive layers, conductive plates). The semiconductor device structure 100 may include, for example, a NAND Flash memory array. The semiconductor device structure 100 may include vertical strings 101 of memory cells 103 that are coupled to each other in series. The vertical strings 101 may extend vertically and orthogonal to conductive lines and tiers, such as data lines 102, a source tier 104, the conductive tiers 105, access lines 106, first select gates 108 (e.g., upper select gates, drain select gates (SGDs)), select lines 109, and a second select gate 110 (e.g., a lower select gate, a source select gate (SGS)). Vertical conductive contacts 111 may electrically couple components to each other as shown, such as the select lines 109 to the first select gates 108, the access lines 106 to the conductive tiers 105, etc. The semiconductor device structure 100 may also include a control unit 112 positioned under the memory array, which may include at least one of string driver circuitry, pass gates, circuitry for selecting gates, circuitry for selecting conductive lines (e.g., the data lines 102, the access lines 106), circuitry for amplifying signals, and circuitry for sensing signals. The control unit 112 may be electrically coupled to the data lines 102, source tier 104, access lines 106, first select gates 108, and second select gate 110, for example.

Insulating materials between the elements shown in FIG. 1 are omitted from FIG. 1 for clarity. Insulating materials may be formed of an oxide material, for example, or another dielectric material, as is known in the art. Conductive materials and structures may be formed of a metal material, a polysilicon material, or other doped or undoped electrically conductive materials, as is known in the art. In addition, some components, such as some conductive tiers 105, access lines 106, select lines 109, and vertical conductive contacts 111, are also omitted from FIG. 1 to more clearly show other features of the semiconductor device structure 100, such as the vertical strings 101 of the memory cells 103.

For example, FIG. 1 illustrates only four conductive tiers 105, although the semiconductor device structure 100 may, in reality, include any number of conductive tiers 105, such as 16, 32, or 64 conductive tiers 105. Additionally, FIG. 1 illustrates only an end portion of a block of memory cells 103 to clearly show various components and electrical connections. In reality, the block of memory cells 103 may extend longitudinally a much greater distance to the right in the perspective of FIG. 1, as will be explained below with reference to FIG. 2.

The first select gates 108 may extend horizontally in a first direction x (e.g., to the left and right from the perspective of FIG. 1) and may be coupled to respective first groups of vertical strings 101 of memory cells 103 at a first end (e.g., an upper end) of the vertical strings 101. The second select gate 110 may be formed in a substantially planar configuration and may be coupled to the vertical strings 101 at a second, opposite end (e.g., a lower end) of the vertical strings 101 of memory cells 103.

The data lines 102 (e.g., bit lines) may extend horizontally in a second direction y (e.g., up and down from the perspective of FIG. 1) that is at an angle (e.g., perpendicular) to the first direction in which the first select gates 108 extend. The data lines 102 may be coupled to respective second groups of the vertical strings 101 at the first end (e.g., the upper end) of the vertical strings 101. A first group of vertical strings 101 coupled to a respective first select gate 108 may share a particular vertical string 101 with a second group of vertical strings 101 coupled to a respective data line 102. Thus, a particular vertical string 101 may be selected at an intersection of a particular first select gate 108 and a particular data line 102.

The conductive tiers 105 (e.g., word line plates) may extend in respective horizontal planes. The conductive tiers 105 may be stacked vertically, such that each conductive tier 105 is coupled to all of the vertical strings 101 of memory cells 103, and the vertical strings 101 of memory cells 103 extend vertically through the stack of conductive tiers 105. The conductive tiers 105 may be coupled to or may form control gates of the memory cells 103 to which the conductive tiers 105 are coupled. Each conductive tier 105 may be coupled to one memory cell 103 of a particular vertical string 101 of memory cells 103.

The first select gates 108 and the second select gate 110 may operate to select a particular vertical string 101 of memory cells 103 between a particular data line 102 and the source tier 104. Thus, a particular memory cell 103 may be selected and electrically coupled to a data line 102 by operation of (e.g., by selecting) the appropriate first select gate 108, second select gate 110, and conductive tier 105 that are coupled to the particular memory cell 103.

As shown in FIG. 1, the conductive tiers 105 may be configured to include the stair step structure 120 along an end of the conductive tiers 105 (e.g., along the left end of the conductive tiers 105 when viewed in the perspective of FIG. 1) to define contact regions for respectively coupling the access lines 106 (e.g., word lines) to the conductive tiers 105 with the vertical conductive contacts 111. Thus, portions of the conductive tiers 105 may be formed as respective stair steps of the stair step structure 120. The stair step structure 120 may be a structure that includes contact regions (also referred to as "stair steps") at different vertical elevations and that extend to different distances in the horizontal direction. For example, the contact region of a conductive tier 105 relatively proximate an underlying substrate may extend horizontally beyond the contact region of a conductive tier 105 relatively more distant from the underlying substrate. A lower stair step may extend horizontally a sufficient distance beyond a next higher stair step to define a contact region on the lower stair step sufficiently large to form a vertical conductive contact 111 coupled to the contact region and electrically isolated from the next higher stair step. The stair step structure 120 may be formed at a longitudinal end of a memory array block, as will be explained below with reference to FIG. 2.

Referring to FIG. 2, a simplified semiconductor device structure 200 is illustrated that shows a top view of two memory array blocks 250 arranged laterally adjacent to each other. Each of the memory array blocks 250 may include a conventional stair step structure 220 at a longitudinal end thereof. Conventionally, many memory array blocks 250 are arranged laterally adjacent to each other in a semiconductor device structure 200. Each memory array block 250 may be similar to the structure shown in FIG. 1, except the memory array blocks 250 of FIG. 2 are shown as including fewer conductive tiers 205 than the complete structure of FIG. 1, for simplicity of explanation. As shown in FIG. 2 for illustration purposes, each memory array block 250 may include vertical memory strings 201 that extend through four conductive tiers 205 (e.g., word line plates). First select gates 208 (e.g., upper select gates, drain select gates (SGDs)) extending horizontally in the x direction and data lines 202 (e.g., bit lines) extending horizontally in the y direction at an angle (e.g., perpendicular) to the x direction may be coupled to upper ends of the vertical memory strings 201. The stair step structure 220 formed at a longitudinal end (e.g., a left end when viewed from the perspective of FIG. 2) of each memory array block 250 may form contact regions for coupling access lines 206 (e.g., word lines) to respective conductive tiers 205 using vertical conductive contacts 211. Each memory array block 250 has a lateral width W and a longitudinal length L, as shown in FIG. 2. By way of example and not limitation, the width W may be on the order of about 2 μm to about 20 μm and the length L may be on the order of about several hundreds or thousands of microns. In addition, each block 250 may include sub-blocks each corresponding to a respective first select gate 208. For example, each block 250 shown in FIG. 2 includes two first select gates 208 and, therefore, two corresponding sub-blocks.

Generally speaking, as 3-D semiconductor device technology has advanced, additional feature density (e.g., number of memory cells per unit of area) has been provided, in part, by forming blocks to a greater vertical height and having a higher number of conductive tiers (e.g., word line plates). However, greater numbers of conductive tiers per block require a corresponding greater number of contact regions and access lines. Referring to FIG. 2 for purposes of illustration, additional contact regions may be defined by forming additional stair steps in each stair step structure 220. However, forming additional stair steps may conventionally require forming each memory array block 250 at a greater width W, to provide sufficient space for the additional access lines 206. In addition, a number of first select gates 208 and corresponding sub-blocks per block 250 used to uniquely access all memory cells in each block 250 may be increased as the width W is increased. For example, if each block 250 of FIG. 2 were to include eight conductive tiers 205 and eight access lines 206 instead of the four that are shown, the width W and the number of first select gates 208 and corresponding sub-blocks per block 250 may be approximately doubled to accommodate the additional access lines 206. However, increasing the width W and/or the number of first select gates 208 and corresponding sub-blocks per block 250 may be undesirable. Alternatively or additionally, the access lines 206 may be formed at a smaller size (e.g., pitch) to fit the additional access lines 206 into a given width W. However, reducing the size of the access lines 206 may significantly increase the cost of forming the access lines 206, such as requiring more advanced and expensive lithographic tools. In addition, reducing the size of the access lines 206 may cause performance problems, such as due to an increased electrical stress (e.g., stress across a dielectric) between adjacent access lines 206 that are formed closer to each other.

Figure 3:
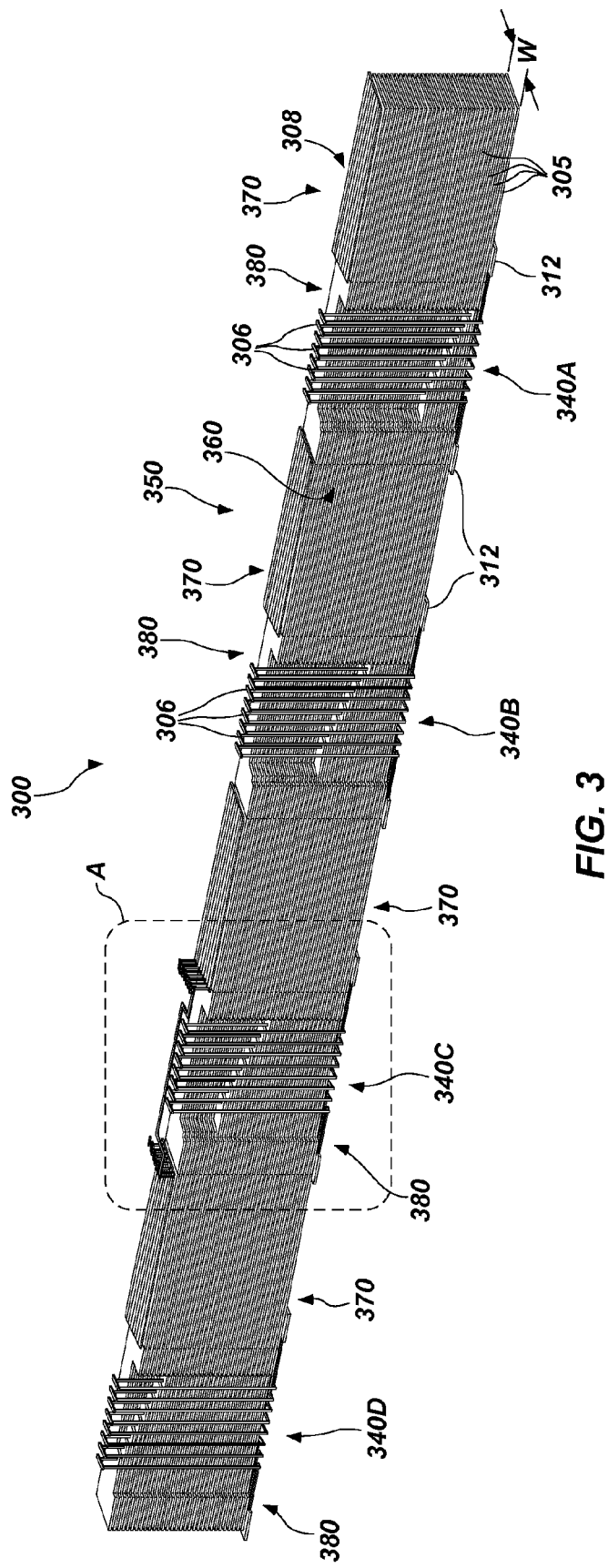
FIGS. 3 through 5 illustrate different views of a memory array block of a semiconductor device structure according to an embodiment of the present disclosure.
Figure 4:
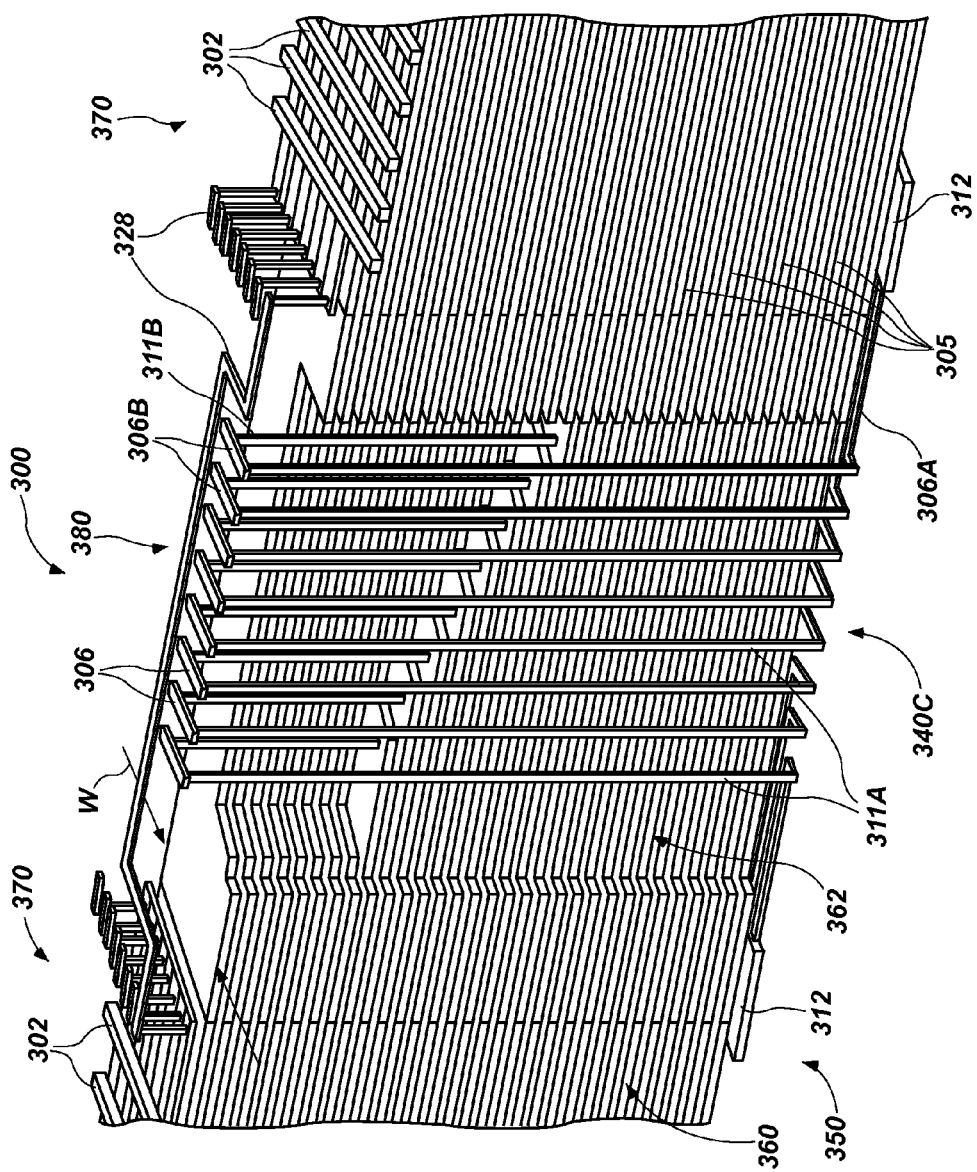
Figure 5:
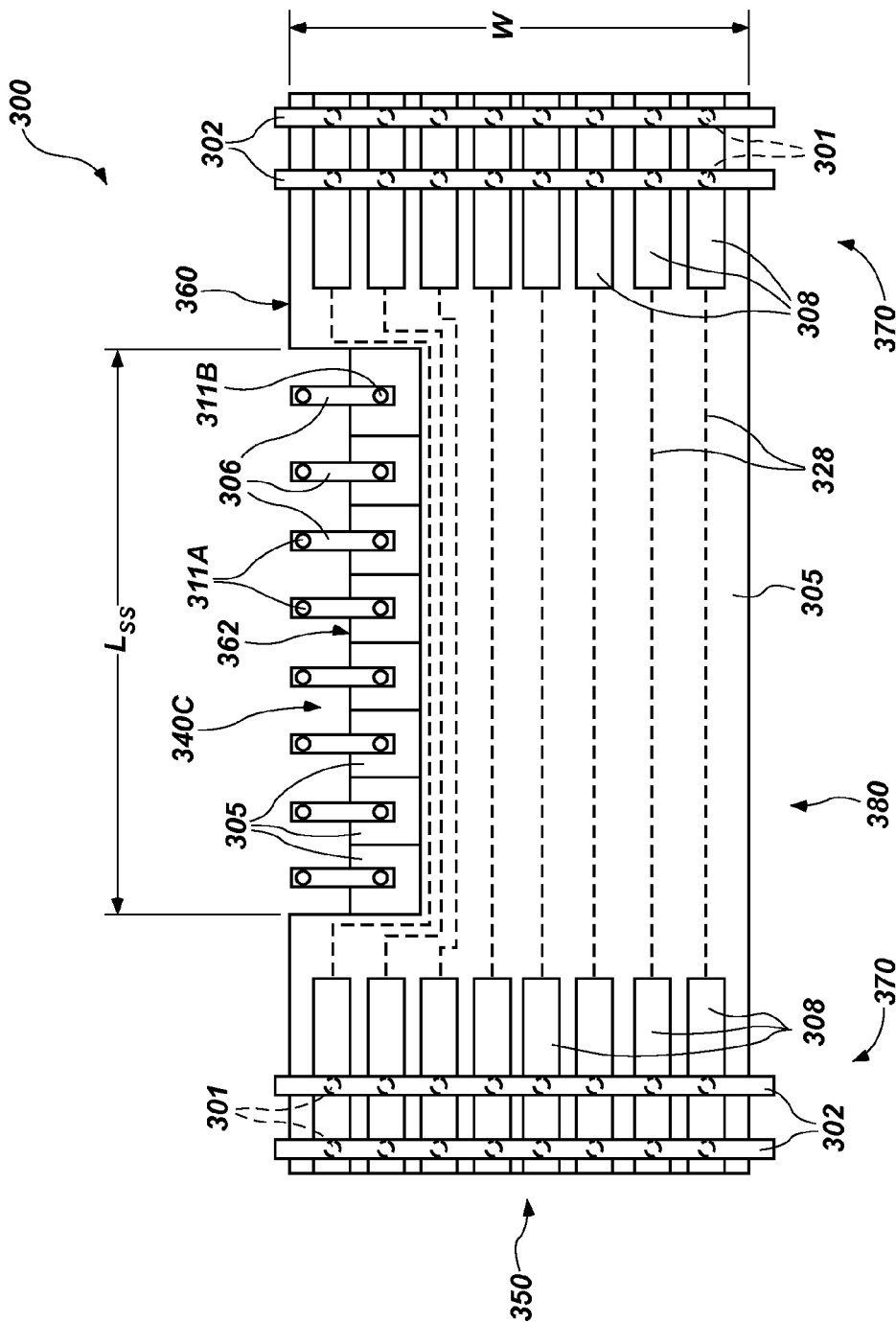

Referring to FIGS. 3 through 5, an embodiment of a semiconductor device structure 300 including at least one memory array block 350 according to the present disclosure is illustrated. The memory array block 350 may include one or more stair step structures 340A, 340B, 340C, 340D (generically referred to by reference numeral 340) positioned between longitudinal ends of the memory array block 350, rather than at a longitudinal end, such as along a lateral side surface 360 of the memory array block 350. In addition, the one or more stair step structures 340 may each be positioned between opposing lateral side surfaces 360 of the memory array block 350. Positioning the one or more stair step structures 340 in this manner may enable the use of any number of conductive tiers 305 without contributing to an increase in the lateral width W of the memory array block 350 and/or without forming access lines 306 at a smaller size (e.g., at a reduced pitch). Indeed, embodiments of the memory array block 350 according to the present disclosure may enable the lateral width W to be decreased and/or may alleviate electrical stress between adjacent access lines 306 by forming the access lines 306 at a larger size and/or with increased distance between adjacent access lines 306, as will be described below. In addition, in embodiments in which the access lines 306 are formed at a larger size, electrical resistance through the access lines 306 may be reduced.

The memory array block 350 may include substantially planar, elongated conductive tiers 305 (e.g., word line plates) arranged in a vertical stack and separated by substantially planar insulating materials (not shown for clarity). As shown in FIGS. 3 and 4, for example, the memory array block 350 may include 32 conductive tiers 305. However, the present disclosure is not limited to memory array blocks 350 having 32 conductive tiers 305. Rather, memory array blocks according to the present disclosure may include any number of conductive tiers 305. By way of example and not limitation, memory array blocks of the present disclosure may include 16 or more conductive tiers 305, such as 16, 32, 64, or 128 conductive tiers 305. In some embodiments, the memory array block 350 may include 32 or more conductive tiers 305, such as 64 or 128 conductive tiers 305.

As noted above, the one or more stair step structures 340 may be positioned between longitudinal ends of the memory array block 350, such as along the lateral side surface 360 and between opposing lateral side surfaces 360 of the memory array block 350. In some embodiments, the longitudinal ends of the memory array block 350 may lack a stair step structure. As shown in FIG. 3, a first stair step structure 340A may define contact regions for electrically contacting a first portion of the conductive tiers 305, such as the eight conductive tiers 305 closest to an underlying substrate. A second stair step structure 340B may define contact regions for electrically contacting a second portion of the conductive tiers 305, such as the eight conductive tiers 305 next closest to the underlying substrate. A third stair step structure 340C may define contact regions for electrically contacting a third portion of the conductive tiers 305, such as the eight conductive tiers 305 next closest to the underlying substrate. A fourth stair step structure 340D may define contact regions for electrically contacting a fourth portion of the conductive tiers 305, such as the eight conductive tiers 305 most distant from the underlying substrate. The stair step structures 340 may be separated from one another by one or more structures, such as other portions of the conductive tiers 305 lacking a stair step structure 340.

Although each of the stair step structures 340 is shown in FIGS. 3 through 5 as defining contact regions for eight of the conductive tiers 305, the present disclosure is not so limited. By way of example and not limitation, each stair step structure 340 may define contact regions for 4, 8, 12, 16, or more than 16 conductive tiers 305. Furthermore, although four stair step structures 340A through 340D are shown in FIG. 3, any number of stair step structures 340 may be used. For example, in some embodiments, the memory array block 350 may include one, two, three, four, or more than four (e.g., eight) stair step structures 340. The number of stair step structures may be selected based on manufacturing and space considerations, for example. One of ordinary skill in the art may select the number of stair step structures 340 in a given memory array block 350 and the number of contact regions defined by each stair step structure 340 based on, for example, complexity and cost of manufacturing, quantity of conductive tiers 305, desired lateral width W of the memory array block 350, etc.

Vertical strings 301 (FIG. 5) of memory cells may extend through the conductive tiers 305, as discussed above with reference to the vertical strings 101 of FIG. 1 and the vertical strings 201 of FIG. 2. First select gates 308 (e.g., upper select gates, drain select gates (SGDs)) may extend substantially longitudinally along the memory array block 350 in a first horizontal direction and may be coupled to ends (e.g., upper ends) of the vertical strings 301 of memory cells. The memory array block 350 may include sub-blocks each corresponding to a respective first select gate 308. In addition, data lines 302 (e.g., bit lines) (FIGS. 4 and 5) may extend laterally across the memory array block 350 in a second direction at an angle (e.g., perpendicular) to the first direction and may be coupled to the ends (e.g., the upper ends) of the vertical strings 301 of memory cells, as described above with reference to the data lines 102 of FIG. 1 and the data lines 202 of FIG. 2. Although not shown in FIGS. 3 through 5 for clarity, the memory array block 350 may include a second select gate similar to the second select gate 110 of FIG. 1. Each of the first select gates 308 may, for example, be a control gate of first select transistors coupled to the data lines 302.

At least one of the one or more stair step structures 340 may be positioned between longitudinal ends of the memory array block 350. At least one of the stair step structures 340 may be between first and second portions of a memory array defined by the memory array block 350. The first portion of the memory array may include a first plurality of the first select gates 308 and the second portion of the memory array may include a second plurality of the first select gates 308. Each of the first select gates 308 may extend in a particular direction (e.g., longitudinally) over the stack of conductive tiers 305. Thus, in some embodiments, at least one of the stair step structures 340 may be positioned longitudinally between (e.g., directly between) a first portion (i.e., group) of the vertical strings 301 (FIG. 5) and a second, different portion (i.e., group) of the vertical strings 301. For example, as shown in FIG. 5, the stair step structure 340C may be positioned longitudinally between a first portion of vertical strings 301 on the left of FIG. 5 and a second portion of vertical strings 301 on the right of FIG. 5. Thus, proceeding from one longitudinal end to an opposite longitudinal end of the memory array block 350, the memory array block 350 may be defined by alternating memory array regions 370 including first select gates 308 and stair step regions 380 lacking first select gates 308 (see FIGS. 3 through 5). The memory array regions 370 may include vertical strings 301 of memory cells and first select gates 308, while the stair step regions 380 may be free of vertical strings 301 of memory cells and free of first select gates 308.

Contact regions defined by each of the one or more stair step structures 340 may be aligned in the same direction that the first select gates 308 extend over the stack of conductive tiers 305. The first select gates 308 extending over the stack of conductive tiers 305 may have a collective lateral width (e.g., a width in a direction orthogonal to the particular direction in which the conductive tiers 305 extend). Each of the one or more stair step structures 340 may also have a lateral width (e.g., a width in a direction orthogonal to the direction in which the memory array block 350 extends), which may be less than the collective lateral width of the first select gates 308.

Accordingly, embodiments of the present disclosure include semiconductor device structures that include at least one memory array block defined by an elongated stack of conductive tiers. The at least one memory array block includes one or more stair step structures positioned between longitudinal ends of the memory array block. The one or more stair step structures define contact regions for electrically contacting respective conductive tiers of the elongated stack of conductive tiers. The one or more stair step structures are also positioned longitudinally between a first portion of vertical strings of memory cells and a second portion of vertical strings of memory cells.

In addition, embodiments of the present disclosure include semiconductor device structures that include elongated memory array blocks laterally adjacent to one another. Each of the memory array blocks includes a vertical stack of horizontal conductive tiers separated by electrically insulating materials and at least one stair step structure defined by portions of the conductive tiers. The at least one stair step structure is positioned along a lateral side of the memory array block and between opposing lateral side surfaces of the memory array block for providing electrical access to respective conductive tiers of the vertical stack of horizontal conductive tiers.

Access lines 306 may electrically couple respective conductive tiers 305 to one or more control units 312, which may be positioned under the memory array block 350. Each of the one or more control units 312 may include at least one of string driver circuitry, pass gates, circuitry for selecting gates, circuitry for selecting conductive lines (e.g., the data lines 302, the access lines 306), circuitry for amplifying signals, and circuitry for sensing signals. For example, the one or more control units 312 may include transistors (e.g., so-called "pass gates") that are electrically coupled to access lines 306 for selecting a desired one of the conductive tiers 305, for example.

As shown in FIG. 4, in some embodiments, the access lines 306 may include lower horizontal portions 306A, upper horizontal portions 306B, laterally outer vertical portions 311A, and laterally inner vertical portions 311B. The lower horizontal portions 306A may be coupled to and extend between the one or more control units 312 and respective outer vertical portions 311A. The outer vertical portions 311A may be coupled to and extend between the lower horizontal portions 306A and the upper horizontal portions 306B. The upper horizontal portions 306B may be coupled to and extend between the outer vertical portions 311A and the inner vertical portions 311B. The inner vertical portions 311B may be coupled to and extend between the upper horizontal portions 306B and respective conductive tiers 305 of the stair step structure 340. Thus, the access lines 306 may form an electrical connection between the one or more control units 312 and respective conductive tiers 305 of the stair step structure 340, to provide electrical access to the conductive tiers 305, such as for reading, writing, or erasing data associated with memory cells of the vertical strings 301.

As shown in FIGS. 4 and 5, a lateral side surface 362 of the stair step structures 340 may be recessed from a plane defined by the lateral side surface 360 of the memory array block 350 toward a center of the memory array block 350, such as to enable the outer vertical portions 311A of the access lines 306 to be positioned along the lateral side surface 360 without adding significant, if any, width W to the memory array block 350. The outer vertical portions 311A of the access lines 306 may be aligned in a plane that is parallel to the plane defined by the lateral side surface 360 of the memory array block 350. In some embodiments, the outer vertical portions 311A of the access lines 306 may be positioned between planes defined by opposing lateral side surfaces 360 of the memory array block 350.

Accordingly, embodiments of the present disclosure also include semiconductor device structures including at least one three-dimensional memory array block elongated in a horizontal direction. The at least one three-dimensional memory array block includes a vertical stack of conductive tiers, a lateral side surface, and at least one stair step structure. The at least one stair step structure includes contact regions of at least some of the conductive tiers of the vertical stack of conductive tiers. The at least one stair step structure is recessed from the lateral side surface of the at least one three-dimensional memory array block.

The stair step structures 340 may extend laterally across only a portion of the width W of the memory array block 350. Thus, a portion of the stair step portion 380 of the memory array block 350 laterally adjacent (i.e., in a direction laterally across the memory array block 350, up and down in the view of FIG. 5) to each stair step structure 340 may be free of the stair step structure 340 and may include all of the conductive tiers 305 of the memory array block 350. Thus, all of the respective conductive tiers 305 of the memory array regions 370 on longitudinally opposing sides of the stair step portion 380 may be continuous and in electrical communication with each other through the stair step portion 380.

As shown in FIGS. 3 and 4, two control units 312 may be associated with each stair step structure 340. A first control unit 312 may be positioned under (e.g., at least partially under) a first memory array region 370 and a second, different control unit 312 may be positioned under (e.g., at least partially under) a second memory array region 370, as shown in FIG. 3. The first control unit 312 may be electrically coupled to a first half (e.g., four) of the access lines 306 associated with the stair step structure 340 and the second, different control unit 312 may be electrically coupled to a second half (e.g., four) of the access lines associated with the stair step structure 340. Thus, only one half (e.g., four) of the lower horizontal portions 306A of the access lines 306 associated with one of the stair step structures 340 may be positioned across the width W of the memory array block 350. Accordingly, the lower horizontal portions 306A of adjacent access lines 306 may be spaced at a greater distance from each other to alleviate electrical stress and reduce manufacturing costs compared to access lines that are associated with a stair step structure positioned at a longitudinal end of a memory array block, such as the stair step structure 120 shown in FIG. 1. For example, if the memory array block according to FIG. 1 includes 16 conductive tiers 105, a width of the memory array block and number of first select gates 108 would need to be sufficient to accommodate at least 16 access lines 106. To form the memory array block of FIG. 1 at a relatively small width and using fewer first select gates 108, the access lines 106 would be formed at a small size and relatively close to one another, as explained above. Accordingly, embodiments of the present disclosure may enable more flexibility in the design and formation of the access lines 306 and the spacing thereof.

In addition, spacing between the vertical portions 311A, 311B and the upper horizontal portions 306B of adjacent access lines 306 may be greater than spacing between adjacent access lines that are associated with a stair step structure positioned at a longitudinal end of a memory array block. As shown in FIGS. 3 through 5, the contact regions defined by each of the stair step structures 340 may be aligned substantially parallel to a longitudinal length of the memory array block 350 and substantially parallel to a plane defined by the lateral side surface 360 of the memory array block 350. The upper horizontal portions 306B of the access lines 306 associated with each of the stair step structures 340 may extend laterally from over the stair step structure 340 toward the plane defined by the lateral side surface 360 and substantially perpendicular to the plane defined by the lateral side surface 360. A length $L_{SS}$ (FIG. 5) of the stair step structure may be adjusted as desired to provide sufficient space for forming the access lines 306 such that electrical stress and manufacturing cost is reduced or maintained at a relatively low level, without adding significant width W and/or number of first select gates 308 and corresponding sub-blocks to the memory array block 350 as a whole, or even while reducing the width W and/or number of first select gates 308 and corresponding sub-blocks of the memory array block 350. By way of example and not limitation, while conventional access lines associated with 32 conductive tiers are formed with a distance between the access lines of less than 100 nm, such as about 45 nm, adjacent access lines 306 according to the present disclosure may be separated by a distance of at least about 100 nm, such as 200 nm, 300 nm, 500 nm, or 1 µm. Such beneficial configurations may exist regardless of the number of conductive tiers 305 included in the memory array block 350.

Although FIG. 4 illustrates two control units 312 positioned under and longitudinally adjacent to the stair step structure 340C (e.g., at least partially directly under respective memory array regions 370), other configurations are included in the present disclosure. For example, one or more control units 312 may be positioned directly under the stair step structure 340C (i.e., at the same longitudinal position along the length of the memory array block 350 as the stair step structure 340C). In such embodiments, the lower horizontal portions 306A of the access lines 306 may extend only in a lateral direction from the one or more control units 312 to the outer vertical portions 311A. Stated another way, the lower horizontal portions 306A may not include any portion that extends longitudinally parallel to a longitudinal length of the memory array block 350. Alternatively, the lower horizontal portions 306A may be omitted and the outer vertical portions 311A may be directly coupled to the one or more control units 312.

Since the stair step structures 340 are used instead of a stair step structure at a longitudinal end of the memory array block 350, an overall longitudinal length of the memory array block 350 according to the present disclosure may be the same, less than, or only slightly greater than a conventional memory array block including a stair step structure at a longitudinal end, even if the length $L_{SS}$ of each stair step structure 340 is increased to provide additional space for the access lines 306, as described above. Any such lengthening of the memory array block 350 may be insignificant relative to the benefits of reducing the width W of the memory array block 350 and/or providing increased space between access lines 306 enabled by embodiments of the present disclosure.

Referring again to FIGS. 4 and 5, the first select gates 308 (e.g., upper select gates, drain select gates (SGDs)) may longitudinally extend over the stack of conductive tiers 305. In some embodiments, the first select gates 308 may extend directly over and adjacent to the stack of conductive tiers 305 only over one or more portions of the memory array block 350, such as over and adjacent to the memory array portions 370 of the memory array block 350. However, the first select gates 308 may not extend over the stair step regions 380 of the memory array block 350, due to the position of one or more of the stair step structures 340 and the access lines 306. In the stair step regions 380, one or more electrical lines 328 may be used to electrically couple a first portion of the first select gates 308 over a first memory array portion 370 to respective first select gates 308 of a second portion of the first select gates 308 over a second memory array portion 370 on longitudinally opposite sides of the stair step region 380. The one or more electrical lines 328 may be sufficiently laterally thin to be routed around the stair step structures 340 and/or the access lines 306.

As shown in FIGS. 4 and 5, the memory array block 350 may include eight first select gates 308 and corresponding sub-blocks laterally adjacent to each other. In comparison with the structure of FIG. 1, fewer first select gates 308 and corresponding sub-blocks may be used for a given number of conductive tiers 305. For example, if the structure of FIG. 1 includes 32 conductive tiers 105, a width of the stair step structure 120 may be sufficient to position at least 16 first select gates 108 and corresponding sub-blocks over the structure. However, if the same number of 32 conductive tiers 305 are used in the structure of FIGS. 4 and 5, the width W of the memory array block 350 may be sufficient for only eight or even fewer (e.g., four) first select gates 308 and corresponding sub-blocks. Accordingly, embodiments of the present disclosure include semiconductor device structures 300 including memory array blocks 350 that may have at least 32 conductive tiers and at most eight first select gates 308 and corresponding sub-blocks, such as having 64 conductive tiers 305 and eight first select gates and corresponding sub-blocks. By way of example and not limitation, the memory array blocks 350 of the present disclosure may include at least 32 conductive tiers 305 and have a lateral width W that is about 5 µm or less, such as about 3 µm or less. In some embodiments, the memory array blocks 350 may include 64 or more conductive tiers 305 and have a lateral width W that is about 2 µm or less. The reduced width W of each of the memory array blocks 350 may result in fewer first select gates 308 and corresponding sub-blocks that are used to uniquely access all of the memory cells in the memory array block 350.

Accordingly, embodiments of the present disclosure include vertical memory devices that include at least one elongated vertical memory array block including vertical strings of memory cells and at least one stair step structure including contact regions of respective conductive tiers thereof. The at least one vertical memory array block may include at least 32 conductive tiers for selecting the memory cells and may have a lateral width of about 5 µm or less. The vertical strings of memory cells may extend through the at least 32 conductive tiers.

In addition, embodiments of the present disclosure include semiconductor memory devices including at least one memory array block including at least 16 conductive tiers and at least two stair step structures defining contact regions to the at least 16 conductive tiers. The at least two stair step structures are located between longitudinal ends of the at least one memory array block. At least 16 access lines are electrically coupled to respective contact regions defined by the at least two stair step structures. A portion of the at least one memory array block lacks a stair step structure and is located between the at least two stair step structures.

Additional embodiments of the present disclosure include semiconductor devices including a memory array. The memory array may include a stack of conductive tiers and a stair step structure between first and second portions of the memory array. The stair step structure may include contact regions for respective conductive tiers of the stack of conductive tiers. The first portion of the memory array may include a first plurality of select gates. Each select gate of the first plurality of select gates may extend in a particular direction over the stack of conductive tiers. The second portion of the memory array may include a second plurality of select gates. Each select gate of the second plurality of select gates may also extend in the particular direction over the stack of conductive tiers.

By way of example and not limitation, the semiconductor device structures 300 of the present disclosure may be formed using conventional semiconductor manufacturing techniques. For example, the alternating conductive tiers 305 and insulating materials may be formed using conventional material formation techniques, such as chemical vapor deposition (CVD), physical vapor deposition (PVD), atomic layer deposition (ALD), spin-coating, or combinations thereof. The conductive tiers 305 may be patterned into elongated structures to ultimately define the memory array blocks 350. If desired, portions of the elongated structures may be recessed from a lateral side surface 360 thereof, to form the stair step regions 340 with a recessed lateral side surface 362, as explained above. The stair step structures 340 may be formed by covering portions of an upper conductive tier 305 of the stack of conductive tiers 305 with a first mask, which may be a so-called "hardmask." One or more apertures may be formed through the first mask at desired locations of the stair step structures 340, such as between longitudinal ends (e.g., along the lateral side surface 360) of the memory array blocks 350 to be formed. Each of the stair step structures 340 may be formed through the apertures in the first mask, such as by using a second mask. One or more pairs of conductive materials 305 and insulating material may be removed using the first mask and the second mask to protect portions of the structure to remain, the second mask may be horizontally recessed, and the material removal and recessing operations may be repeated until the desired number of contact regions (e.g., stair steps) are formed, as is known in the art.

Other elements of the structure (e.g., one or more control units 312, access lines 306, first select gates 308, data lines 302, vertical strings 301 of memory cells, etc.) may be formed in the locations and configurations described above using conventional semiconductor fabrication techniques.

Accordingly, the present disclosure includes methods of forming a semiconductor device structure. In accordance with such methods, a stack of alternating conductive tiers and insulating materials is formed and patterned to form at least one elongated memory array block. One or more stair step structures are formed between longitudinal ends of the at least one elongated memory array block and between lateral side surfaces of the at least one elongated memory array block to define contact regions of respective conductive tiers of the stack of alternating conductive tiers and insulating materials.

The present disclosure also includes methods of forming a semiconductor device, which may include forming a memory array including a stack of conductive tiers and positioning a stair step structure between first and second portions of the memory array. Contact regions for respective conductive tiers of the stack of conductive tiers may be defined by the stair step structure. A first plurality of select gates may be formed over the first portion of the memory to extend in a particular direction over the stack of conductive tiers. A second plurality of select gates may be formed over the second portion of the memory array to extend in the particular direction over the stack of conductive tiers.

Methods of operating semiconductor devices include accessing a memory cell of a three-dimensional memory array block, such as the memory array block 350 shown in FIGS. 3 through 5. The memory cell may be accessed by performing one or more of a read operation, a write operation, and an erase operation. As described in detail above, the memory array block 350 may be defined by an elongated stack of conductive tiers and may include at least one stair step structure 340 that defines contact regions for electrically accessing respective conductive tiers 305. The at least one stair step structure 340 may be positioned longitudinally between a first portion of vertical strings 301 of memory cells (e.g., the portion of vertical strings 301 to the left of FIG. 5) and a second portion of vertical strings 301 (e.g., the portion of vertical strings 301 to the right of FIG. 5).

Accessing of the memory cell may be accomplished, in part, by applying a voltage to the access line 306 that is electrically coupled to the desired memory cell. The particular voltage applied to the access line 306 may be based on whether the memory cell is being read from, written to, or erased, for example. For example, during a read operation, the access line 306 that is electrically coupled to the desired memory cell through a conductive tier 305 may be biased to a low (e.g., ground) voltage, while the access lines 306 electrically coupled to the other memory cells in the vertical string 301 through other conductive tiers 305 including the memory cell to be accessed may be biased to a relatively higher voltage (e.g., 5V) to cause the other memory cells to be electrically conductive regardless of their data states. Thus, a voltage across the vertical string 301 may depend on whether the read memory cell is in a charged state (e.g., resulting in high conductivity thereof, resulting in a low voltage across the vertical string 301) or in a non-charged state (e.g., resulting in low or no conductivity thereof, resulting in a high voltage across the vertical string 301).

During a write operation, the access line 306 that is electrically coupled to the desired memory cell through a conductive tier 305 may be biased to a high voltage (e.g., above about 12V) sufficient to drive charge into a floating gate of the memory cell while access lines 306 electrically coupled to the other memory cells in the vertical string 301 through other conductive tiers 305 including the memory cell to be accessed may be biased to a relatively lower voltage (e.g., about 5V) insufficient to drive charge into floating gates thereof.

During an erase operation, a group of memory cells, such as all the memory cells of the memory array block 350, may be erased at substantially the same time (e.g., concurrently). For example, a source tier of the memory array block 350 may be biased to a high voltage (e.g., above about 12V) and a plurality of the access lines 306 and corresponding conductive tiers 305 of the memory array block 350 may be biased to a lower voltage (e.g., ground) sufficient to drive charge from a floating gate of each of the memory cells in the memory array block 350 that are erased.

The methods of operating semiconductor devices according to the present disclosure may provide at least some advantages over conventional methods that may include applying a voltage to an access line. For example, regardless of the voltage level applied to the access lines 306 during an accessing operation of a memory cell, the spacing between the access lines 306 resulting from embodiments of the present disclosure, as discussed above, may reduce electrical stress (e.g., noise) between adjacent access lines 306 that may otherwise exist if the access lines 306 were formed relatively more closely together.

Accordingly, the present disclosure includes methods of operating semiconductor devices. In accordance with such methods, a memory cell of a three-dimensional memory array block may be accessed. The three-dimensional memory array block is defined by an elongated stack of conductive tiers and includes at least one stair step structure positioned between longitudinal ends of the three-dimensional memory array block. The at least one stair step structure defines contact regions for electrically accessing respective conductive tiers of the elongated stack of conductive tiers. The at least one stair step structure is also positioned longitudinally between a first portion of vertical strings of memory cells including the accessed memory cell and a second portion of vertical strings of memory cells.

The embodiments of the disclosure described above and illustrated in the accompanying drawing figures do not limit the scope of the invention, since these embodiments are merely examples of embodiments of the disclosure. The invention is defined by the appended claims and their legal equivalents. Any equivalent embodiments lie within the scope of this disclosure. Indeed, various modifications of the present disclosure, in addition to those shown and described herein, such as alternative useful combinations of the elements described, will become apparent to those of ordinary skill in the art from the description. Such modifications and embodiments also fall within the scope of the appended claims and their legal equivalents.

What is claimed is:

1. A vertical memory device comprising:
    an elongated vertical memory array block including vertical strings of memory cells extending through at least thirty-two conductive tiers; and
    a stair step structure including contact regions of respective conductive tiers of the at least thirty-two conductive tiers,
    wherein the elongated vertical memory array block has a lateral width of about 5 μm or less.

2. The vertical memory device of claim 1, wherein the elongated vertical memory array block has a lateral width of about 3 μm or less.

3. The vertical memory device of claim 1, wherein the vertical strings of memory cells extend through sixty-four conductive tiers.

4. The vertical memory device of claim 1, wherein the vertical strings of memory cells extend through one hundred twenty-eight conductive tiers.

5. The vertical memory device of claim 1, wherein the vertical memory device comprises multiple stair step structures, each of the multiple stair step structures including contact regions of a portion of the at least thirty-two conductive tiers.

6. The vertical memory device of claim 1, wherein the stair step structure is positioned along a lateral side surface of the elongated vertical memory array block.

7. The vertical memory device of claim 1, further comprising at least thirty-two access lines electrically coupled to the at least thirty-two conductive tiers, respectively, adjacent access lines of the at least thirty-two access lines separated by a distance of at least 100 nm.

8. The vertical memory device of claim 1, further comprising eight or fewer upper select gates extending over the elongated vertical memory array block and coupled to the vertical strings of memory cells.

9. A semiconductor device comprising:
    a memory array block including at least sixteen continuous conductive tiers and two stair step structures defining contact regions to the at least sixteen continuous conductive tiers, the two stair step structures located between longitudinal ends and between two longitudinal portions of the at least sixteen continuous conductive tiers of the memory array block; and
    sixteen access lines electrically coupled to respective contact regions defined by the two stair step structures, wherein a portion of the memory array block lacks a stair step structure and is located between the two stair step structures.

10. The semiconductor device of claim 9, wherein the memory array block comprises at least four stair step structures.

11. The semiconductor device of claim 9, wherein the at least sixteen continuous conductive tiers comprise at least sixteen word line tiers.

12. A method of forming a semiconductor device structure, the method comprising:
    forming a stack of alternating conductive tiers and insulating materials;
    patterning the stack of alternating conductive tiers and insulating materials to form an elongated memory array block; and
    forming a stair step structure between longitudinal ends of the elongated memory array block and between lateral side surfaces of the elongated memory array block to define contact regions of respective conductive tiers of the stack of alternating conductive tiers and insulating materials, wherein the alternating conductive tiers of the stack are continuous from one longitudinal side of the stair step structure to an opposing longitudinal side of the stair step structure.

13. The method of claim 12, wherein forming a stair step structure between lateral side surfaces of the elongated memory array block comprises forming the stair step structure along one of the lateral side surfaces of the elongated memory array block.

14. The method of claim 12, further comprising laterally recessing the stair step structure from a plane defined by one of the lateral side surfaces of the elongated memory array block.

15. The method of claim 12, further comprising electrically coupling access lines to respective contact regions defined by the stair step structure.

16. The method of claim 15, further comprising forming the access lines to have a distance between adjacent access lines of at least about 100 nm.

17. The method of claim 12, wherein:
forming a stack of alternating conductive tiers and insulating materials comprises forming at least thirty-two conductive tiers; and
patterning the stack of alternating conductive tiers and insulating materials to form an elongated memory array block comprises forming the elongated memory array block to have a lateral width of about 5 µm or less.

18. A method of operating a semiconductor device, the method comprising accessing a memory cell of a three-dimensional memory array block defined by an elongated stack of continuous conductive tiers, the three-dimensional memory array block including a stair step structure positioned between longitudinal ends of the three-dimensional memory array block, the stair step structure defining contact regions for electrically accessing respective conductive tiers of the elongated stack of continuous conductive tiers, wherein the stair step structure is positioned longitudinally between a first portion of vertical strings of memory cells of the three-dimensional memory array block including the accessed memory cell and a second portion of vertical strings of memory cells of the three-dimensional memory array block.

19. The method of claim 18, wherein accessing a memory cell includes performing an operation that is selected from the group consisting of a read operation, a write operation, and an erase operation.

20. The method of claim 18, wherein accessing a memory cell comprises applying a voltage to at least one access line of access lines respectively coupled to the contact regions of the stair step structure, the access lines being separated from each other by at least about 100 nm and including outer vertical portions extending along a lateral side surface of the three-dimensional memory array block.

* * * * *